United States Patent [19]

Adar et al.

[11] Patent Number: 5,305,336

[45] Date of Patent: Apr. 19, 1994

[54] COMPACT OPTICAL PULSE SOURCE

[75] Inventors: Renen Adar, Westfield; Victor Mizrahi, Bedminster; Linn F. Mollenauer, Colts Neck; Paul A. Morton, Berkeley Heights, all of N.J.

[73] Assignee: AT&T Bell Laboratories, Murray Hill, N.J.

[21] Appl. No.: 15,664

[22] Filed: Feb. 9, 1993

Related U.S. Application Data

[63] Continuation-in-part of Ser. No. 827,249, Jan. 29, 1992, abandoned.

[51] Int. Cl.$^5$ .............................. H01S 3/098
[52] U.S. Cl. ........................ 372/18; 372/6; 372/96; 385/37
[58] Field of Search ............ 372/6, 20, 96, 18, 19, 372/26; 385/37

[56] References Cited

U.S. PATENT DOCUMENTS

| | | | |
|---|---|---|---|
| 4,469,554 | 9/1984 | Turner | 156/657 |
| 4,725,110 | 2/1988 | Glenn et al. | 350/3.61 |
| 4,786,132 | 11/1988 | Gordon | 385/37 |
| 4,932,989 | 6/1990 | Presby | 65/2 |
| 4,955,028 | 9/1990 | Alferness et al. | 385/37 |
| 5,058,977 | 10/1991 | Sorin | 385/37 |

FOREIGN PATENT DOCUMENTS

| | | | |
|---|---|---|---|
| 0468826A8 | 1/1992 | European Pat. Off. | |
| 0263010 | 11/1991 | Japan | 385/37 |

OTHER PUBLICATIONS

P. A. Morton, et al., "Monolithic hybrid mode-locked 1.3 um semiconductor lasers," Appl. Phys. Lett. 56, (1990) 111-113.
L. F. Mollenauer, et al., "Demonstration of Error-Free Soliton Transmission at 2.5 Gigabits per Second," Elect. Lett. 27, (1991) 2055.
T. Tanbun-Ek, et al., "Effects of strain in multiple quantum well distributed feedback lasers," Appl. Phys. Lett. 57, (1990) 2184.
D. M. Bird, et al., "Narrow Line Semiconductor Lasser Using Fibre Grating," Electr. Lett. 27, (1991) 1115-1116.
R. Adar, et al., "Measurement of very low-loss silica on silicon waveguides with a right resonator," Appl. Phys. Lett. 58, (1991) 444-445.
C. H. Henry et al., "Glass Waveguides on Silicon for Hybrid Optical Packaging," J. Lightwave Tech. 7, (1989) 1530-1539.
G. Raybon et al., "Active Mode-Locking of 1.3 um Extended-Cavity Silicon Chip Bragg Reflector Laser," Elect. Lett. 24, (1988) 1563-1565.
P. A. Morton, et al., "Hybrid Solitron Pulse Source Using a Silica Waveguide External Cavity and Bragg Reflector," Appl. Phys. Lett. 59, (Dec. 2, 1991) 2944-2946.
R. S. Tucker, et al., "40 GHz Active Mode-Locking in a 1.5 um Monolithic Extended-Cavity Laser," Elect. Lett. 25, (1989) 621-622.
M. C. Wu, et al., "Transform-limited 1.4 ps optical pulses from a monolithic colliding-pulse mode-locked quantum well laser," Appl. Phys. Lett. (1990) 759-761.
D. Burns, et al., "Active Mode-Locking of an External Cavity GaInAsP Laser ... Incorporating a Fibre-Grating Reflector," Electronic Letters, vol. 24, No. 23, Nov. 10, 1988, pp. 1439-1441.
G. Eisenstein, et al., "Active Mode-Locking Characteristics of InGaAsP-Single Mode Fiber Composite Cavity Lasers," IEEE Journal of Quantum Electronics, vol. 22, No. 1, Jan. 1986, pp. 142-148.

*Primary Examiner*—Georgia Y. Epps
*Attorney, Agent, or Firm*—Martin I. Finston

[57] ABSTRACT

An optical pulse source includes a semiconductor diode laser, an external optical cavity, and a source of a modulated drive current such that the laser can be actively mode-locked. The external cavity includes an optical fiber and a distributed Bragg reflector. In preferred embodiments, the optical pulse source can produce pulses having a time-bandwidth product within about 20% of the transform limit, such that soliton pulses can be transmitted.

15 Claims, 4 Drawing Sheets

COMPACT OPTICAL PULSE SOURCE

This application is a continuation-in-part of application Ser. No. 07/827,249, filed on Jan. 29, 1992, abandoned.

FIELD OF THE INVENTION

This invention relates to mode-locked lasers, and more particularly, to mode-locked semiconductor diode lasers suitable as pulse-sources for optical communication.

ART BACKGROUND

For long-distance optical fiber communication, it is desirable to provide a source of transform-limited optical pulses which is compact, reliable and stable, and which operates at an appropriate wavelength and repetition rate. In particular, it is currently believed that for soliton-based communication, a wavelength of about 1.55 μm, a pulse width of 15-60 ps, and a repetition rate roughly in the range of 2.5-10 GHz are desirable. Actively mode-locked, semiconductor diode lasers are advantageously used as sources of optical pulses for such purposes. However, there are several problems associated with the conventional use of external air cavities for mode-locking. Such cavities generally require the use of bulk optics, a diffraction grating for wavelength control, and an etalon for bandwidth control. As a consequence, optical alignment is a complicated and difficult matter, and it is difficult to provide a cavity which is compact enough for general use in optical communication. As an alterative, monolithic mode-locked lasers have been proposed. Such lasers are described, for example, in P. A. Morton, et al., "Monolithic hybrid mode-locked 1.3 μm semiconductor lasers," *Appl. Phys. Lett.* 56 (1990) 111-113. However, the small physical dimensions of such devices permit operation only at repetition rates which are relatively high, and generally greater than preferred maximum rates for purposes of data transmission. Moreover, some such devices lack adequate bandwidth control to produce relatively long pulses which are transform limited.

SUMMARY OF THE INVENTION

Described herein is an optical pulse source which is compact, stable, and reliable, and which can provide at least approximately transform-limited optical pulses at appropriate wavelengths, repetition rates, and pulse widths for soliton-based communication. (Soliton-based signal transmission is described, e.g., in L. F. Mollenauer, et al., "Demonstration of Error-Free Soliton Transmission at 2.5 Gigabits per Second over more than 14,000 km," *Elect. Lett.* 27, (1991) 2055.)

In a broad sense, the invention involves a semiconductor diode laser which has at least one output facet through which electromagnetic radiation of at least a given wavelength is emitted, an opposing facet, to be referred to as the "back" facet, an external optical cavity, and means for applying a modulated drive current to the laser at an appropriate modulation frequency for actively mode-locking the laser. The cavity is defined between the back facet and a distributed Bragg reflector (DBR) situated at a given length from the output facet. The external cavity is not an air cavity, but instead lies substantially within waveguiding means. One end of the waveguiding means is proximal, and optically coupled, to the output facet, and the waveguiding means have at least one end distal the facet. The DBR is formed by spatially modulating the effective refractive index in a portion of the waveguiding means intermediate the proximal and distal ends. (The effective refractive index is related to the propagation constant in the fiber or waveguide, with respect to the propagating mode.) The effective refractive index is modulated in a planar waveguide by, e.g., varying the thickness of the guiding portion of the waveguide. It is modulated in an appropriately doped core of an optical fiber by, e.g., exposing the fiber core to electromagnetic radiation of an effective wavelength such that a physical change takes place. In contrast to the prior an, at least a portion of the waveguiding means comprises a first optical fiber having an end optically coupled to the output facet.

DETAILED DESCRIPTION

Figure 1:
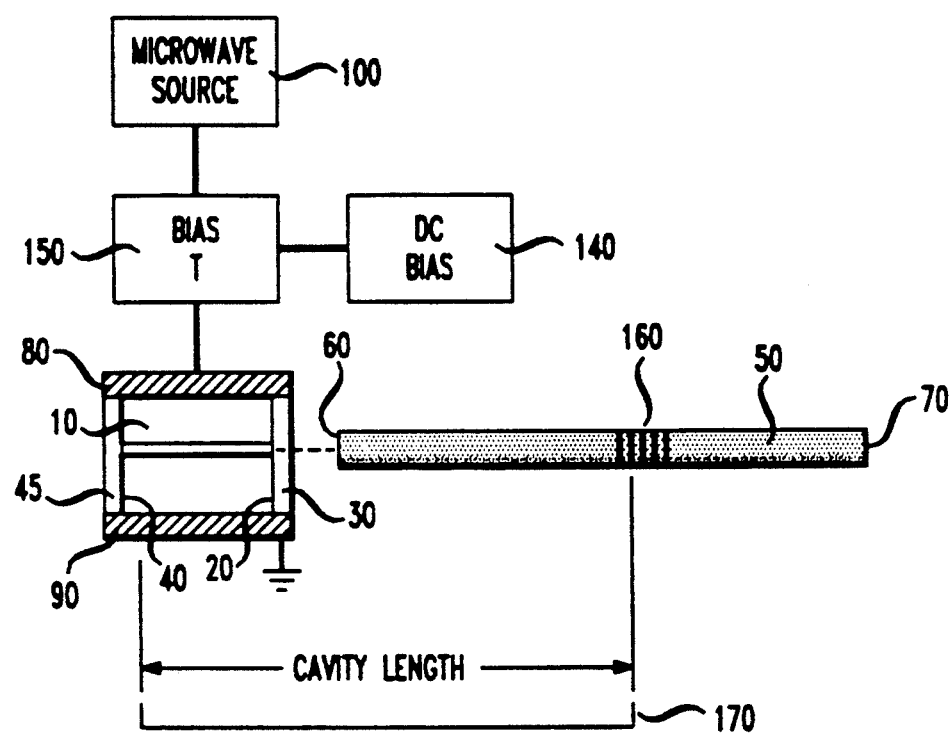
FIG. 1 is a schematic, block diagram of the inventive optical pulse source, in one embodiment.

A block diagram of the inventive optical pulse source is shown in FIG. 1. Semiconductor diode laser 10 typically has a cleaved output facet 20 which is coated with antireflection coating 30. Laser 10 also typically includes cleaved back facet 40, which is optionally coated with high-reflectivity coating 45, or, alternatively, is left uncoated in order to provide a second output useful, e.g., for monitoring purposes. Waveguiding element 50 is optically coupled to facet 20 at proximal end 60, and optical pulses are extracted from element 50 at least at one distal end 70. The ac drive current for the laser is exemplarily delivered to the laser through contacts 80 and 90 from variable-frequency microwave source 100. A dc bias is provided from dc current source 140 by way of bias network 150.

A distributed Bragg reflector (DBR) 160 is defined in a portion of element 50 intermediate ends 60 and 70. In general, the DBR is formed by impressing a pattern of modulations of the effective refractive index of the waveguiding element. Specific embodiments will be discussed in greater detail below. Defined between facet 40 and DBR 160 is optical cavity 170. As is discussed below, the spatially distributed nature of the DBR results in an effective cavity length which depends, to a limited extent, upon the operating conditions of the pulse source.

Although various alterative semiconductor diode lasers are envisioned, we currently prefer to use a strained quantum well laser operating, e.g., at about 1.55 μm. Such lasers are well-known to practitioners in the art, and are described, e.g., in T. Tanbun-Ek, et al., *Appl. Phys. Lett.* 57, (1990) 2184.

Associated with the optical cavity is a round-trip time for optical pulses propagating therewithin. The multiplicative inverse of such round-trip time is refer-red to as the "fundamental cavity frequency." The laser is actively mode-locked by modulating the drive current at frequencies close to the fundamental cavity frequency.

It is generally believed that the performance of a mode-locked laser is very sensitive to the modulation frequency. In particular, the pulse width and the time-bandwidth product are generally believed to increase steeply as the modulation frequency is detuned away from the optimal frequency. However, we have discovered that the inventive optical pulse source has a surprisingly broad useful range of modulation frequencies. For example, in experiments, we have measured pulse widths of about 55 ps together with a time-bandwidth product of less than 0.5 over a bandwidth greater than 60 MHz, centered on a frequency of about 3.875 GHz. According to our current understanding, this effect is attributable to the spatially distributed nature of the Bragg reflector. That is, the distance to the effective reflection position within the reflector depends on wavelength. It is shortest at the Bragg wavelength, and increases for wavelengths both longer and shorter than the Bragg wavelength. As a consequence, the effective length of the optical cavity may vary as the operating wavelength is varied. If the modulation frequency is changed, the center wavelength of the output spectrum shifts, and concomitantly, the effective cavity length also changes. Through such changes in the effective cavity length, the optical pulse source tends to self-adjust in such a way that resonance is maintained. For example, we have observed, in an experimental optical pulse source, a center wavelength of 1.5475 μm at modulation frequencies above 4.1 GHz. That is the same wavelength that the experimental device exhibited under dc operation. However, reducing the modulation frequency below 4.1 GHz caused the center wavelength to decrease. We observed a maximum wavelength shift of over 1 Å for a modulation frequency change of 300 MHz.

Figure 2:
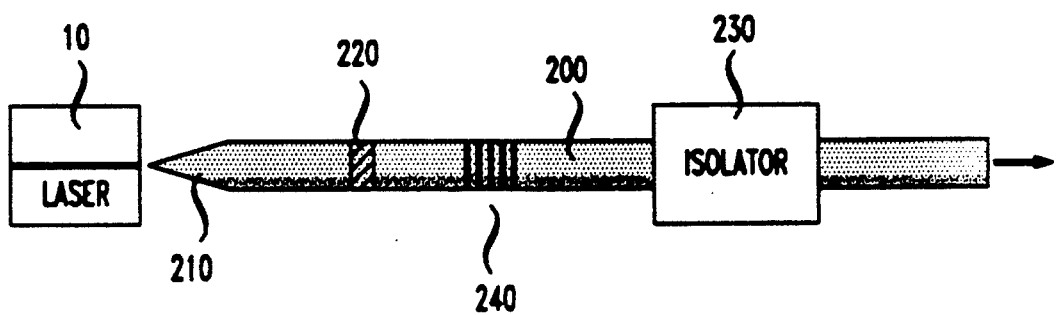
FIG. 2 is a schematic diagram of the inventive pulse source in a currently preferred embodiment in which a substantial portion of the optical cavity lies within an optical fiber, and the DBR is formed in the fiber.

In a currently preferred embodiment, the waveguiding element is an optical fiber. A substantial portion of the optical cavity, typically about 80% or more of the total optical length of the cavity, lies within the optical fiber. Turning now to FIG. 2, such an optical fiber 200 includes a lensed end 210 through which it is optically coupled to laser 10. Lensed optical fibers are well-known in the art, and are described, for example, in U.S. Pat. No. 4,469,554, issued to D. R. Turner on Sep. 4, 1984, and in U.S. Pat. No. 4,932,989, issued to H. M. Presby on Jun. 12, 1990. The lensed portion may be formed in a separate fiber stub, which is then readily attached to a distal fiber portion by means of fusion splice 220. However, it is preferable to avoid including a splice within the optical cavity, because such splices introduce optical loss, and tend to complicate the precise determination of the optical cavity length. The length of the optical cavity is primarily determined by the positioning of the gating. For that reason, it is desirable to position the grating with an accuracy of one millimeter or better, and preferable to position it with an accuracy of a few tenths of a millimeter. Such accuracy is readily achievable by a skilled practitioner.

In at least some cases, an optical isolator 230 is advantageously incorporated at a point distal DBR 240 for the purpose of preventing transmitted electromagnetic radiation from reflecting back into the laser.

DBR 240 is typically formed by a photoinduced effect. That is, a permanent alteration in the refractive index of at least some silica-based glasses is effected by exposure to electromagnetic radiation, such as ultraviolet radiation. For example, such alterations are readily made in a silica fiber having a germanium-doped core by exposure to radiation of wavelength 242 nm from, e.g., an excimer-pumped, frequency-doubled, tunable, dye laser. (One commercially available optical fiber which is useful in that regard is manufactured by AT&T under the tradename ACCUTETHER 220.) In an optical interferometric arrangement, a series of interference fringes of radiation of the effective wavelength is readily produced with a periodicity appropriate for the DBR. The DBR is formed by exposure of an optical fiber to such an interference pattern. This technique is well-known in the art, and is described, for example, in U.S. Pat. No. 4,725,110, issued to W. H. Glenn, et al., on Feb. 16, 1988. An external cavity laser which uses such a DBR, but is not mode-locked, is described in D. M. Bird, et al., "Narrow Line Semiconductor Laser Using Fibre Grating," *Electr. Lett.* 27 (1991) 1115–1116.

Figure 3:
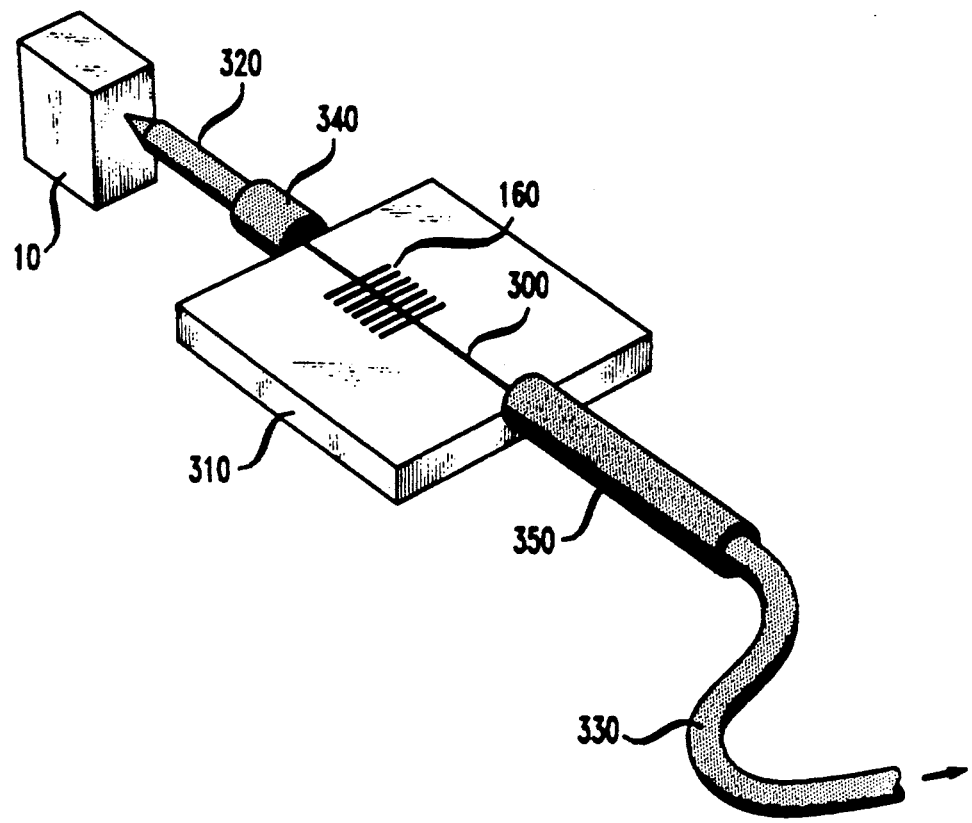
FIG. 3 is a schematic diagram of an alternate embodiment of the inventive pulse source, in which the DBR is formed in a planar waveguide.

Turning now to FIG. 3, the waveguiding element, in an alternate embodiment, is a planar, silica-based glass waveguide 300 formed on, e.g., a silicon substrate 310. Such waveguides are well-known in the art. For example, a phosphorus-doped silica ("p-glass") waveguide is described in R. Adar, et al., "Measurement of very low-loss silica on silicon waveguides with a ring resonator," *Appl. Phys. Lett.* 58 (1991) 444–445, and is also described in C. H. Henry, et al., "Glass Waveguides on Silicon for Hybrid Optical Packaging," *J. Lightwave Tech.* 7 (1989) 1530–1539. Such a waveguide typically has a p-glass, core, doped with 6.5% -8% phosphorus, deposited on a hipox base layer and covered with a cladding layer of silica glass doped with 2% phosphorus. The base layer is typically 15 μm thick to prevent optical leakage into the silicon substrate, and the core is typically 4–5 μm thick and 7 μm wide.

A first-order Bragg reflector is typically formed by photolithographically patterning the waveguide by standard silicon processing techniques, followed by etching to a depth of, e.g., 0.5 μm into the core of the waveguide. The measured reflectivity of an exemplary such reflector had a full width at half-maximum (FWHM) of 1.7 Å. The maximum reflectivity of the exemplary reflector was 77%, and the physical length of the reflector was 7 mm.

Practitioners in the art have, in fact, previously used a waveguide integrated with a grating on a silicon substrate as an external, mode-locking cavity. That is, G. Raybon, et al., "Active Mode-Locking of 1.3-μm Extended-Cavity Silicon Chip Bragg Reflector Laser," *Electr. Lett.* 24 (1988) 1563–1565, describes the use of a silicon nitride, buried rib waveguide butt coupled to a laser chip, and integrated with a silicon chip Bragg reflector. However, the optical pulse source described therein exhibited a time-bandwidth product about five times the transform limit (for Gaussian-shaped pulses). This value is believed to be too high for soliton-transmission systems. For soliton transmission, it is desirable to provide a time-bandwidth product less than about 1.2 times the transform limit. (The inventive optical pulse source is also useful as a source of short pulses in, e.g., timing systems and transmission systems that do not involve the propagation of solitons. In such systems, it is desirable to provide pulses having a time-bandwidth product less than about three times the transform limit.) The failure, in the work cited, to provide such low values may be partially attributable to propagation losses in the silicon nitride waveguide, and to coupling loss between the waveguide and the butt-coupled laser chip.

We have overcome the problems in the prior art, and have achieved a time-bandwidth product which is less than 1.2 times the transform limit. We have achieved this objective, in part, by using a silica-based glass waveguide, which provides reduced propagation loss relative to a silicon nitride waveguide. Furthermore, we have improved the optical coupling between the laser chip and the waveguide by adding a lensed section 320 of optical fiber between the laser chip and the planar waveguide. The lensed end of the fiber is juxtaposed to the output facet of the laser, and the opposing end of the fiber is butt-coupled to the planar waveguide. We have found that the use of a lensed fiber not only decreases coupling loss, but also improves the stability of the resulting system, relative to mechanical vibrations. The length of the fiber is typically less than one-half the total length of the optical cavity.

A preferred method for extracting optical output from the pulse source is to butt couple a second section 330 of optical fiber to the distal end of waveguide 300. We have found that this method permits easier assembly and incurs less coupling loss than, for example, coupling an output fiber to the back facet of the laser. Short capillary tube sections 340 and 350 are typically provided in order to facilitate handling and alignment of the optical fiber sections.

Figure 4:
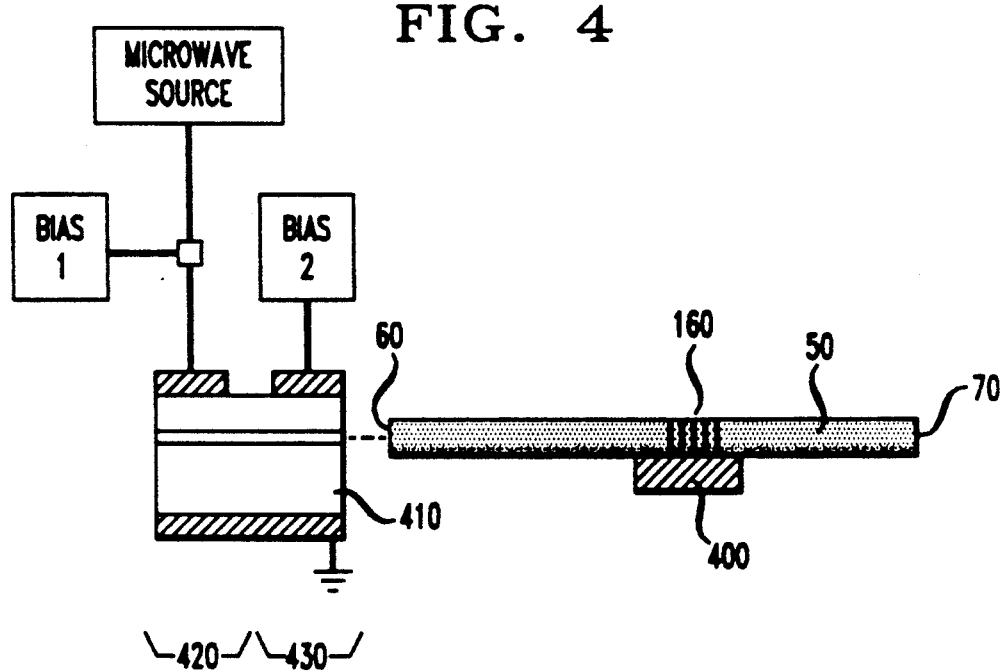
FIG. 4 is a schematic diagram of an alternate embodiment of the inventive pulse source which includes means for varying the Bragg wavelength of the DBR, and independent means for varying the optical path length of the optical cavity.
Figure 5:
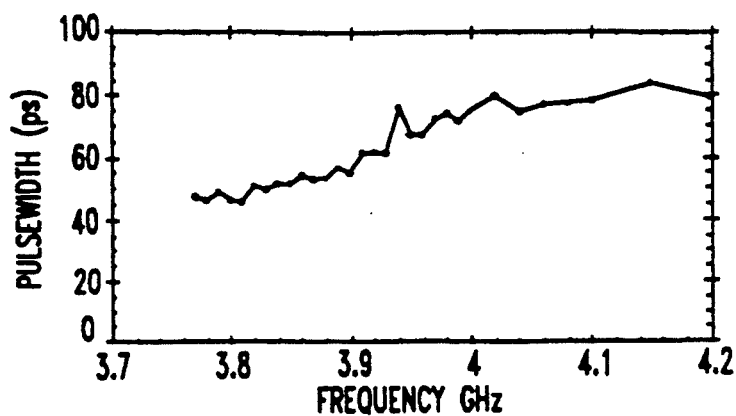
FIG. 5 is a graph of the pulsewidth measured as a function of modulation frequency for an exemplary optical pulse source made according to the invention.
Figure 6:
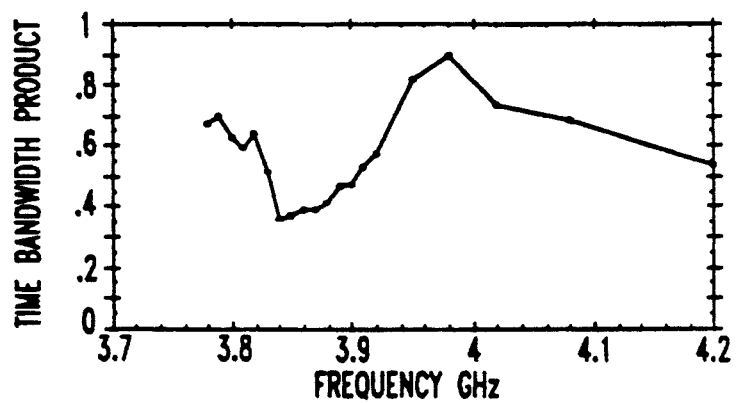
FIG. 6 is a graph of the time-bandwidth product measured as a function of modulation frequency for an exemplary optical pulse source made according to the invention.
Figure 7:
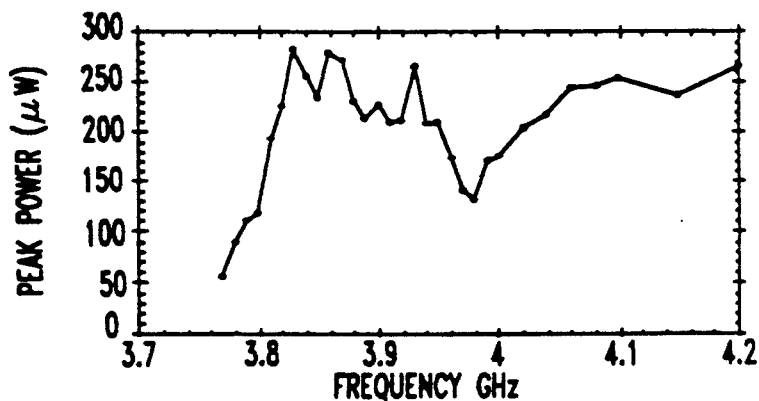
FIG. 7 is a graph of the peak power measured as a function of modulation frequency for an exemplary optical pulse source made according to the invention.
Figure 8:
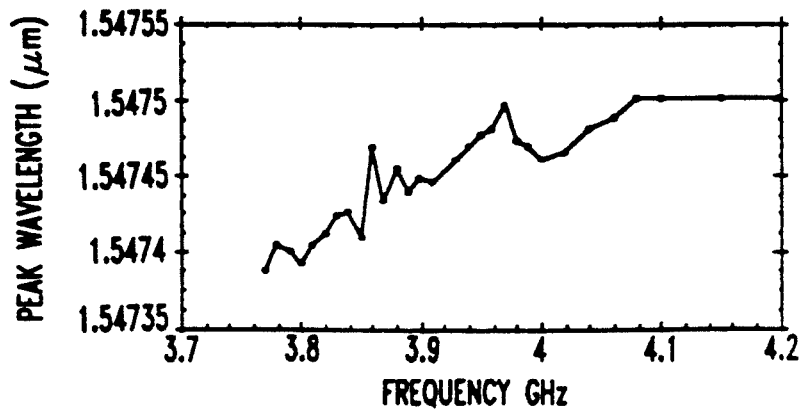
FIG. 8 is a graph of the peak output wavelength measured as a function of modulation frequency for an exemplary optical pulse source made according to the invention.

In at least some cases, it may be desirable to tune the DBR in order, for example, to precisely match the Bragg wavelength to the design wavelength of a particular communication system, or to correct for errors which cause the operating wavelength of the laser to deviate from the desired wavelength. Means are available for tuning a DBR which has been formed in, e.g., an optical fiber or a planar waveguide. Such tuning is achieved by expanding or contracting the length of the DBR. For example, a controlled expansion of the DBR may be effected by a small electrical resistance heater. It has been estimated that the Bragg wavelength of a DBR formed in an optical fiber may be changed by as much as 0.02 nm per Celsius degree, or even more. A second method for changing the length of a DBR, at least as formed in an optical fiber, is to affix the DBR portion of the fiber to a piezoelectric transducer, and to change the dimensions of the transducer by applying an appropriate voltage. Yet a third method is to affix the optical fiber to a support element, such as a bimetallic strip, which deforms when it is heated. Controlled expansion or contraction of the DBR is then readily brought about by heating the deformable element. Means 400 for tuning the DBR are illustrated schematically in FIG. 4. Also illustrated there are multiple-section laser 410, having modulated section 420 and waveguide section 430.

If the length of the DBR is varied as described, it may also be desirable to provide means for varying the length of the proximal fiber portion such that the cavity length can be varied independently of variations in the length of the DBR. Such means are readily used to cause a complementary change in the optical path length of a portion of the optical cavity exclusive of the DBR, such that the overall optical path length of the cavity remains constant while the DBR is tuned. Such a complementary change is readily brought about by a mechanical expansion or contraction, as described. Alteratively, the optical path length may be changed by varying the effective refractive index within a portion of the optical cavity. Such variation is readily brought about in, for example, a multiple-section diode laser, in which a waveguide section is interposed between the modulated section and the output facet. An independent, dc bias is applied to the waveguide section. The effective refractive index, and therefore the optical path length, within the waveguide section is varied by varying the bias on that section. Such lasers are well-known in the art, and are described, for example, in P. A. Morton, et al., "Monolithic hybrid mode-locked 1.3 μm semiconductor lasers," *Appl. Phys. Lett.* 56 (1990) 111–113.

EXAMPLE 1

An optical pulse source having an optical fiber cavity was made substantially as described above. A single-mode fiber having a germanium-doped core and a lensed end was used. The cavity length was about 40 mm. The DBR was photoinduced substantially as described. The Bragg wavelength was 1.5328 μm. The measured reflectivity of the DBR had a peak value of 63% and a full width at half-maximum (FWHM) of 2.0 Å. The physical length of the DBR (FWHM) was 5 mm.

Active mode locking was performed at the optimal modulation frequency of 2.37 GHz and a bias level of 36 mA. The ac drive current was provided by delivering a signal, at a power level somewhat less than one watt, from a high-power, sinusoidal microwave source into a step recovery diode to produce an inverted, short-pulse waveform. The diode output was sent through an inverter to produce positive pulses, and the inverter output was applied to the laser.

Mode-locked pulses were obtained having a full width at half-maximum of 18.5 ps, an optical bandwidth of 1.3 Å (i.e., 16.7 GHz), and a time-bandwidth product of 0.31, which is at the transform limit for a sech-squared pulse shape. The threshold current of the laser was 11 milliamperes, and the peak optical power output was 49 mW.

EXAMPLE 2

An optical pulse source including a planar, p-glass waveguide integrated on a silicon substrate with a DBR was made substantially as described above. Active mode locking was performed at the optimal modulation frequency of 3.84 GHz, a bias level of 60 mA, and an rf power level of 20.4 dBm. Mode-locked pulses were obtained having a full width at half-maximum of 51 ps, an optical bandwidth of 7 GHz, and a time-bandwidth product of 0.36. This product is very close to the theoretical minimum time-bandwidth product of 0.31 for sech-squared shaped pulses, and is adequate for soliton transmission. The output wavelength was 1.547 μm.

As noted, the pulse source displayed a surprisingly broad range of useful modulation frequencies. FIGS. 5-8 show, respectively, the frequency dependence of the deconvoluted pulse width, time-bandwidth product, peak optical output power, and peak wavelength of the pulse source. During the measurements of FIGS. 3-6, the dc bias current was fixed at 60 mA and the ac current was optimized for best performance. As noted, a pulse width of about 55 ps was obtained, together with a time-bandwidth product less than 0.5, over a modulation frequency range of over 60 MHz. It is believed that by using a more complex grating in the DBR, such as a chirped grating, an even greater useful frequency range can be obtained.

We have found that the inventive pulse source can exhibit self-tuning behavior. That is, the fundamental cavity frequency is inversely proportional to the effective optical length of the cavity. This length, in turn, depends on the operating wavelength. If the DBR has a constant period (i.e., the DBR is not chirped), the effective optical length will be somewhat longer for wavelengths slightly longer or shorter than the design wavelength of the DBR. The self-tuning behavior is observed when the modulation frequency is slightly lower than the fundamental cavity frequency corresponding to the design wavelength. In such cases, the operating wavelength may spontaneously increase or decrease by a small amount. As a consequence, the effective optical length of the cavity is increased, the fundamental cavity frequency is reduced to roughly the same value as the modulation frequency, and mode-locking is preserved.

However, because the self-tuned device will have a choice of two possible operating wavelengths, the optical output spectrum can exhibit instabilities. For example, we have observed, in some cases, a twin-lobed optical spectrum.

These instabilities can be avoided by using a DBR which does not behave symmetrically relative to wavelength that lie, respectively, above and below the design wavelength. For example, a linearly chirped DBR can be used to assure than only one operating wavelength will correspond to a given modulation frequency. In the chirped DBR, the Bragg condition will be satisfied only in a short segment of the grating. The longitudinal position of that segment will depend on the operating wavelength. In a rough sense, each possible operating wavelength will be reflected from a segment situated at a unique one of these longitudinal positions. Each of these positions will correspond to a unique value of the fundamental cavity frequency. At a given modulation frequency, the laser will self-tune by adopting that operating wavelength that gives a fundamental cavity frequency matched to the modulation frequency.

By using a relatively long, chirped reflector, it is possible to accommodate relatively large changes in modulation frequency while preserving mode-locked operation. This is quite surprising for a mode-locked laser system. For example, we were able to mode-lock a device similar to that described above over a frequency range of 2.1-2.8 GHz. Over this 700-MHz range, the center wavelength of the device varied by 3 Å.

It should be noted in this regard that chirped gratings are useful not only for stabilizing the operation of mode-locked lasers, but also for stabilizing continuously operating (cw) diode lasers. That is, the laser cavity is generally able to support a multiplicity of closely spaced, Fabry-Perot resonant modes. Ideally, only one of these modes experiences maximum gain, and the light emitted by a cw laser corresponds exclusively to this mode. However, it often happens in practice that substantial emission occurs in more than one mode. One undesirable consequence of this is so-called "mode-beating noise," which causes the output optical power to fluctuate. Surprisingly, we have found that in at least some cases of continuous operation of laser 10, chirping of the DBR will reduce mode-beating noise below detectable limits.

Figure 9:
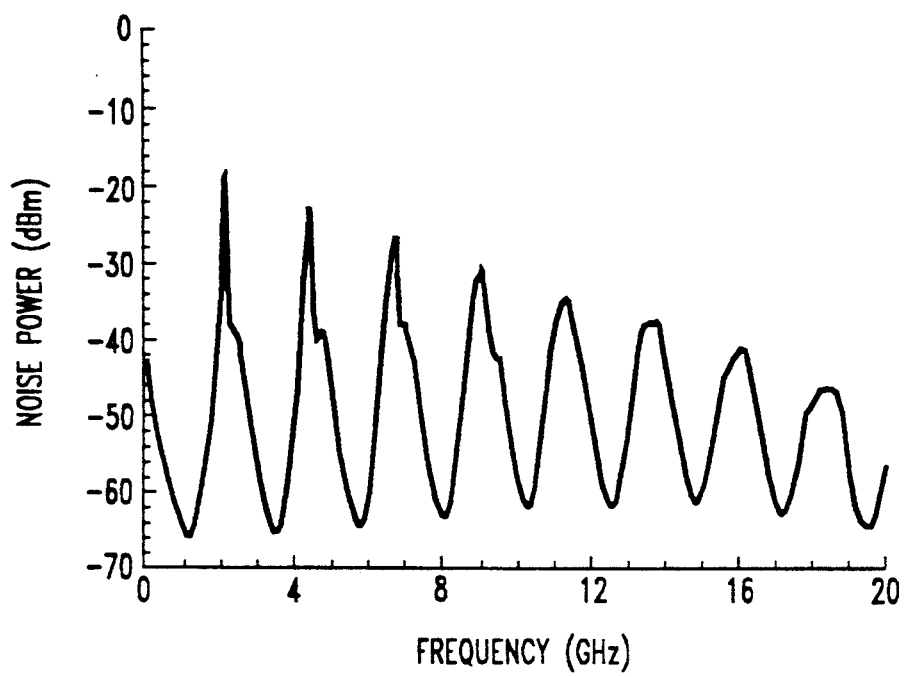
FIG. 9 is a typical noise power spectrum of a cw laser system of the prior art, of the kind that includes a semiconductor diode laser and an external optical cavity terminated by a DBR. Spectral peaks indicating mode-beating noise are clearly visible in the spectrum.
Figure 10:
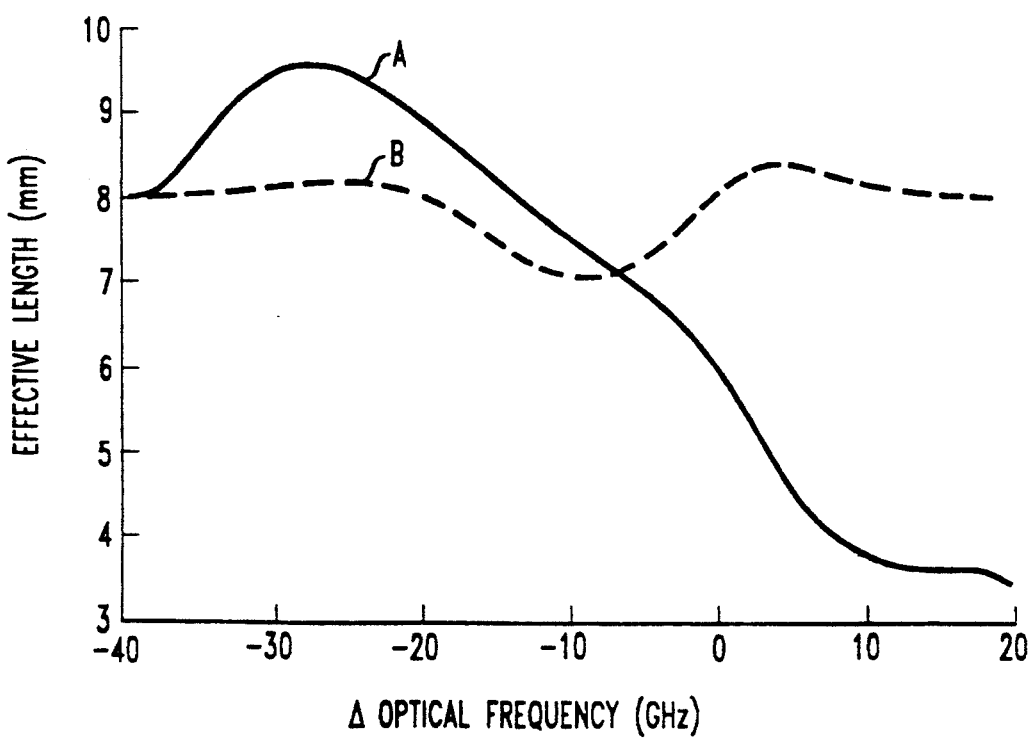
FIG. 10 is a graph of the effective lengths of two illustrative DBRs as functions of optical frequency. Curve A represents a DBR having an approximately linear chirp, and Curve B represents a DBR having a constant period.

FIG. 9 is the noise power spectrum of the continuous optical emission from a laser system as described above, including a DBR having a constant period. Peaks at numerous, uniformly spaced beat frequencies are clearly visible. When we substituted a DBR having an approximately linear chirp, these peaks were completely eliminated. The chirped DBR was oriented such that the local Bragg wavelength was largest at the end proximal the diode laser, and smallest at the distal end. (In some cases, the reverse orientation may also be effective.) The strength of the DBR (i.e., the magnitude of the quasiperiodic refractive index perturbations) was smallest near the ends, and greatest near the center, and had an approximately Gaussian profile. The effective length of this DBR is shown in FIG. 10 as a function of optical frequency. In the figure, Curve A represents the chirped DBR, and Curve B represents a typical DBR having a constant period. The optical frequencies of FIG. 10 are referred to the wavelength of maximum reflectivity of a hypothetical DBR whose background refractive index is unaffected by the perturbations. (In a real DBR, the spatial average of these perturbations contributes to the effective background index. Often, this background contribution has a Gaussian profile, which may add a small quadratic component to the total chirp of the DBR.)

We claim:
1. Apparatus comprising:
    a) a semiconductor diode laser having a back facet and opposing the back facet at least one output facet through which electromagnetic radiation is emitted;
    b) optical waveguide means situated adjacent and external to the laser, the waveguide means including a distributed Bragg reflector, to be referred to as a "DBR", situated a given length from the output facet such that an optical cavity is defined between the back facet and the DBR with respect to the emitted electromagnetic radiation; and
    c) means for applying a modulated drive current to the laser at an appropriate modulation frequency for actively mode-locking the laser such that optical pulses having approximately a given wavelength are emitted from the laser;

characterized in that d) the waveguiding means comprise a first optical fiber having an end proximal and optically coupled to the output facet.

2. Apparatus of claim 1, wherein: the first optical fiber has a core and an end distal the output facet; the DBR comprises a pattern of refractive index modulations formed in at least the core of the first optical fiber at a location intermediate the proximal and distal fiber ends such that a proximal fiber portion is defined between the proximal end and the DB R and a distal fiber portion is defined between the DBR and the distal fiber end; a substantial portion of the optical cavity lies within the proximal fiber portion; and the DBR is partially transmissive at least at the given wavelength such that a portion of the emitted electromagnetic radiation is transmitted into the distal fiber portion.

3. Apparatus of claim 1, wherein: the waveguiding means comprise a planar waveguide having a core which comprises phosphorus-doped silica, said waveguide having an end proximal the output facet and at least one end distal the output facet; the DBR comprises a series of modulations of the thickness of the waveguide; the first optical fiber is situated intermediate the output facet and the proximal film end such that the proximal film end is optically coupled to the output facet via the first optical fiber; and the DBR is partially transmissive at least at the given wavelength, such that electromagnetic radiation can be extracted from the waveguide into a second optical fiber having an end situated adjacent the distal waveguide end.

4. Apparatus of claim 1, wherein the proximal end of the first optical fiber comprises lens means.

5. Apparatus of claim 1, wherein a time-bandwidth product is associated with the optical pulses, the time-bandwidth product has a theoretical lower limit, to be referred to as the "transform-limited value", and the DBR has a bandwidth adapted such that the time-bandwidth product is less than about three times the transform-limited value.

6. Apparatus of claim 1, wherein a time-bandwidth product is associated with the optical pulses, the time-bandwidth product has a theoretical lower limit, to be referred to as the "transform-limited value", and the DBR has a bandwidth adapted such that the time-bandwidth product is less than about 1.2 times the transform-limited value.

7. Apparatus of claim 2, wherein the DBR has a wavelength of maximum reflectivity, to be referred to as the "DBR wavelength"; and the apparatus further comprises means for varying the optical length of the DBR such that the DBR wavelength is varied.

8. Apparatus of claim 7, further comprising means for varying the length of the proximal fiber portion such that the cavity length can be varied independently of variations in the length of the DBR.

9. Apparatus of claim 1, wherein the DBR is quasiperiodic and has a local period that changes with position along the optical fiber.

10. Apparatus of claim 9, wherein the local period changes monotonically with position along the optical fiber.

11. Apparatus of claim 10, wherein the local fiber changes approximately linearly with position along the optical fiber.

12. Apparatus comprising:
a) a semiconductor diode laser having a back facet and, opposing the back facet, at least one output facet through which electromagnetic radiation is emitted;
b) an optical fiber situated adjacent and external to the laser and having an end proximal and optically coupled to the output facet, the optical fiber including a distributed Bragg reflector, to be referred to as a "DBR", situated a given length from the output facet such that an optical cavity is defined between the back facet and the DBR with respect to the emitted electromagnetic radiation; and
c) means for applying a drive current to the laser such that the laser has continuous optical output,
characterized in that
d) the DBR is quasiperiodic and has a local period that changes monotonically with position along the optical fiber.

13. Apparatus of claim 12, wherein the local period changes approximately linearly with position along the optical fiber.

14. Apparatus of claim 12, wherein the local period changes such that continuous operation of the laser is substantially confined to one mode of the optical cavity.

15. Apparatus of claim 12, wherein the local period changes such that mode-beating noise is substantially eliminated from the optical output of the laser during continuous operation of the laser.

* * * * *